United States Patent
Bottomley et al.

(10) Patent No.: US 11,949,377 B2
(45) Date of Patent: Apr. 2, 2024

(54) MODIFIABLE OSCILLATOR CIRCUIT FOR OPERATING MODES

(71) Applicant: Microchip Technology Incorporated, Chandler, AZ (US)

(72) Inventors: Andrew Bottomley, San Diego, CA (US); David Simmonds, Poway, CA (US)

(73) Assignee: Microchip Technology Incorporated, Chandler, AZ (US)

(*) Notice: Subject to any disclaimer, the term of this patent is extended or adjusted under 35 U.S.C. 154(b) by 0 days.

(21) Appl. No.: 17/987,153

(22) Filed: Nov. 15, 2022

(65) Prior Publication Data

US 2023/0378911 A1    Nov. 23, 2023

Related U.S. Application Data

(60) Provisional application No. 63/344,204, filed on May 20, 2022.

(51) Int. Cl.
*H03B 5/24* (2006.01)
*G06F 1/32* (2019.01)
*G06F 1/3296* (2019.01)

(52) U.S. Cl.
CPC ............. *H03B 5/24* (2013.01); *G06F 1/3296* (2013.01); *H03B 2200/0082* (2013.01); *H03B 2201/0266* (2013.01)

(58) Field of Classification Search
CPC ...... G06F 1/3203; G06F 1/3237; G06F 1/324; G06F 1/3296; H03B 5/20; H03B 5/24; H03B 2200/0082; H03L 7/0802
See application file for complete search history.

(56) References Cited

U.S. PATENT DOCUMENTS 5,550,489 A * 8/1996 Raab ...................... G06F 1/324
                                                        327/147
5,844,435 A * 12/1998 Grundvig .................. G06F 1/08
                                                        327/160
(Continued)

FOREIGN PATENT DOCUMENTS

WO     2009/108106 A1    9/2009    ............ G01S 13/75

OTHER PUBLICATIONS

Partial International Search Report and Invitation to Pay Additional Fees, Application No. PCT/US2022/050204, 10 pages, dated Mar. 9, 2023.

(Continued)

*Primary Examiner* — Levi Gannon
(74) *Attorney, Agent, or Firm* — SLAYDEN GRUBERT BEARD PLLC

(57) ABSTRACT

An device having an oscillator circuit modifiable between a first operating mode and a second operating mode, wherein the first operating mode has a first frequency accuracy and a first power consumption, wherein the second operating mode has a second frequency accuracy and a second power consumption, wherein the second frequency accuracy is more accurate than the first frequency accuracy and the second power consumption is higher than the first power consumption, and a control circuit in communication with the oscillator circuit to modify the operating mode of the oscillator circuit.

21 Claims, 14 Drawing Sheets

(56) References Cited

U.S. PATENT DOCUMENTS

| | | | | |
|---|---|---|---|---|
| 5,845,204 A * | 12/1998 | Chapman | H04W 52/029 | 455/343.1 |
| 6,029,061 A * | 2/2000 | Kohlschmidt | H04W 52/029 | 455/574 |
| 7,660,612 B2 * | 2/2010 | Bultan | H04W 52/0248 | 455/574 |
| 7,702,371 B2 * | 4/2010 | Edwards | H04W 52/029 | 455/343.1 |
| 8,560,875 B2 * | 10/2013 | Shen | H04W 52/028 | 713/400 |
| 2002/0172097 A1 * | 11/2002 | Freed | G06F 1/3203 | 368/108 |
| 2007/0036017 A1 * | 2/2007 | Seo | G11C 11/40615 | 365/222 |
| 2008/0104434 A1 * | 5/2008 | May | G06F 1/3203 | 713/322 |
| 2009/0085685 A1 | 4/2009 | Guo et al. | | 331/185 |
| 2013/0169338 A1 * | 7/2013 | Kuo | G06F 1/3296 | 327/291 |
| 2013/0222069 A1 | 8/2013 | Paidimarri et al. | | 331/47 |
| 2017/0117882 A1 * | 4/2017 | Motz | H03K 3/354 | |
| 2017/0155397 A1 * | 6/2017 | Paidimarri | H03B 5/26 | |
| 2019/0079573 A1 | 3/2019 | Hanson et al. | | |
| 2021/0311540 A1 * | 10/2021 | Wong | G06F 1/28 | |

OTHER PUBLICATIONS

Komawaki, Takuya et al., "Replication of Random Telegraph Noise by Using a Physical-Based Verilog-AMS Model," IEICE Trans. Fundamentals, vol. E100-A, No. 12, pp. 2758-2763, Dec. 1, 2017.

Information Disclosure Statement, Application No. PCT/US2022/050204, 19 pages, May 10, 2023.

* cited by examiner

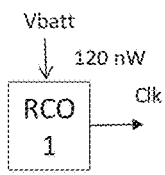
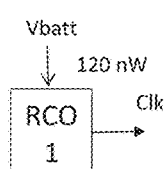
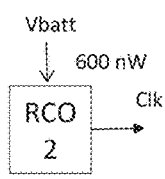
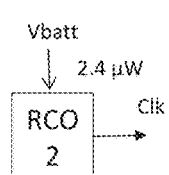
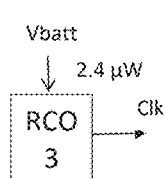
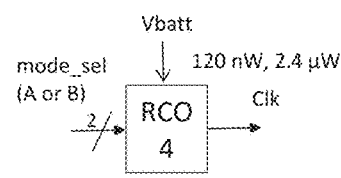
FIGURE 3B
FIGURE 3A
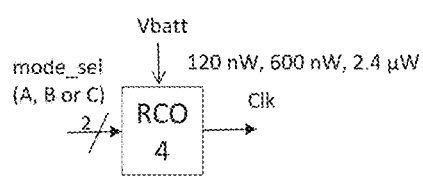
FIGURE 3D
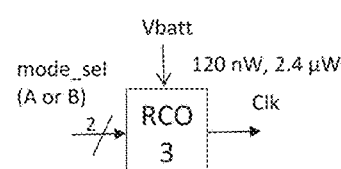
FIGURE 3C
FIGURE 3E

MODIFIABLE OSCILLATOR CIRCUIT FOR OPERATING MODES

RELATED PATENT APPLICATION

This application claims priority to commonly owned U.S. Patent Application No. 63/344,204 filed May 20, 2022, the entire contents of which are hereby incorporated by reference for all purposes.

TECHNICAL FIELD

The present disclosure relates to modifiable oscillator circuits for operating modes having different clock frequency accuracy and power consumption states.

BACKGROUND

Bluetooth is a specification published by Bluetooth SIG, Inc., of Kirkland, Washington, and utilizes low power radio. The specification defines a number of modes of operation, including a peripheral device in an advertising state, a peripheral device in a connection state, and a central device in a connection state. The frequency of low power resistor-capacitor (RC) oscillators may be inaccurate for scheduling Bluetooth connections, i.e. for operation in the connection state for both peripheral and central devices, but may be adequate for meeting the relaxed design constraints for timing advertising events, i.e. for peripheral device operation in the advertising state. For example, hearing aid applications require the use of accurate RC oscillators for the central device of +/−500 ppm for scheduling Bluetooth connections, but medical implant applications may use less accurate RC oscillators (greater than 500 ppm) for timing advertising events. For applications needing accurate RC oscillators, the limiting factor in the design may be the impact of Random Telegraph Noise (RTN). The magnitude of RTN in transistors can be reduced by increasing the area of the transistors, or by increasing the gate bias to move the operating region away from deep weak inversion, or by a combination thereof.

For many low power RC oscillators, the limiting factor on frequency accuracy may be the impact of RTN on the MOSFET transistors and not the impact of white noise or flicker noise. Unfortunately, increasing the area of the transistors alone may not reduce the RTN magnitude sufficiently and increasing the gate bias voltage of the transistors leads to an increase in the power consumption of the oscillator.

There is a need for a way to reduce power consumption in low power RC oscillators used for Bluetooth low energy radio operations, such as hearing aids and medical implants and at the same time meet the frequency accuracy requirements of the peripheral and central connection and advertising use cases.

SUMMARY OF THE INVENTION

The impact of RTN on low power RC oscillators used for Bluetooth Low Energy radio operations may be mitigated by modifying the transistor operating region between weak, moderate and strong inversion using a programmable circuit to maintain a predetermined frequency accuracy.

According to an aspect, there is provided a device comprising: an RC oscillator circuit modifiable between a first operating mode and a second operating mode, wherein the first operating mode has a first frequency accuracy and a first power consumption, wherein the second operating mode has a second frequency accuracy and a second power consumption, wherein the second frequency accuracy is more accurate than the first frequency accuracy and the second power consumption is higher than the first power consumption; and a control circuit in communication with the oscillator circuit to modify the operating mode of the oscillator circuit.

Another aspect provides a method comprising: generating a first clock signal with an oscillator circuit in a first operating mode; transmitting a message using the first clock signal; modifying the oscillator circuit from the first operating mode to a second operating mode; generating a second clock signal with the oscillator circuit in the second operating mode; and transmitting a message using the second clock signal.

According to another aspect, there is provided a system comprising: a power management circuit; a radio circuit electrically connected to the power management circuit, wherein the radio circuit outputs signals to an antenna; an oscillator circuit electrically connected to the power management circuit, wherein the oscillator circuit is modifiable between first and second operating modes, wherein the first operating mode has a first frequency accuracy and a first power consumption, wherein the second operating mode has second frequency accuracy and a second power consumption, wherein the second frequency accuracy is more accurate than the first frequency accuracy and the second power consumption is higher than the first power consumption; a control circuit electrically connected to the radio circuit, the power management circuit and the oscillator circuit, wherein the control circuit modifies the operating mode of the oscillator circuit; and a wake circuit electrically connected to the oscillator circuit and the power management circuit, wherein the wake circuit produces a signal to the power management circuit at least partially based on the operating mode of the oscillator circuit.

BRIEF DESCRIPTION OF THE DRAWINGS

The figures illustrate example oscillator circuits and systems for use in low-power radio applications, such as Bluetooth applications.

FIG. 3A illustrates diagrams of three RC oscillators, respectively operating at different power consumptions.

FIG. 3B illustrates diagrams of two RC oscillators operating respectively at different power consumptions.

FIG. 3C illustrates a diagram of a variable RC oscillator operable at three different power consumption states or modes.

FIG. 3D illustrates a diagram of a variable RC oscillator operable at two different power consumption states or modes.

FIG. 3E illustrates a diagram of three RC oscillators, wherein two of the oscillators operate at different power consumptions and the third oscillator is a variable RC oscillator operable at two different power consumption states or modes.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DESCRIPTION

Power consumption may be reduced in low power RC oscillators used for radio transmissions, such as Bluetooth Low Energy radio operations, but not limited thereto, by modifying the transistor operating region or area between weak and strong inversion using a programmable bias in order to maintain a specified frequency accuracy.

Instead of using one fixed RC oscillator with a frequency accuracy of within +/−500 parts per million (ppm), or another desired frequency accuracy, that consumes a particular level of power to maintain the desired frequency accuracy in the face of noise, including Random Telegraph Noise (RTN), either (1) a plurality of discrete RC oscillators tailored to meet power consumption/frequency accuracy trade-offs to address respective use cases, or (2) one RC oscillator that has two or three bias current/capacitance settings to control the power consumption/frequency accuracy trade-off to address each specific use case.

A low power RC oscillator may be used when low power mode, such as an advertising mode under the above mentioned Bluetooth specification, is implemented. A separate RC oscillator that is internally biased with a higher current and/or larger transistors in order to reduce the magnitude of RTN may be used in some applications where a higher average power consumption may be tolerated. This separate RC oscillator may be used when the mode of operation is to be accurately timed. In this way power consumption may be reduced when frequency accuracy tolerance is not a significant criteria and power consumption may increase when a mode that requires a tighter frequency accuracy tolerance is implemented, in particular, when the frequency tolerance is to be more accurate.

Figure 5:
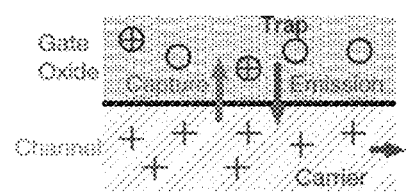
FIG. 5 illustrates one of various examples of RTN in a silicon channel interface.
Figure 6:
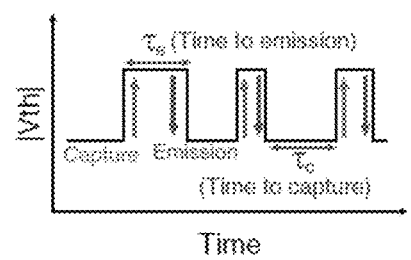
FIG. 6 illustrates one of various examples of the impact of RTN on the threshold voltage of a MOSFET device.

Random Telegraph Noise (RTN), also known as Random Telegraph Signals (RTS), is caused by channel charge carriers being trapped and released close to the transistor gate oxide to silicon channel interface. FIG. 5 shows one of various examples of RTN in a silicon channel interface. When charge carriers are trapped there is a sudden drop in channel current and when released there is a sudden increase in channel current. These sudden 'telegraphic' events may occur with a frequency and magnitude that cannot be predicted and may lead to performance degradation in analog circuits. Low power circuits may be sensitive to RTN as the magnitude of channel current variation, i.e. $\Delta Id/Id$ increases as the transistor is biased further into the weak inversion region (sub-threshold region). This is unfortunate for low power circuits that exploit an increase in transistor gain and low power consumption as this exploitation requires that the transistor be biased relatively deeply into the weak inversion region. FIG. 6 shows one of various examples of the impact of RTN on the threshold voltage (Vt) of a MOSFET device, which shows an increase in Vt in response to a capture event, which increase is maintained for a period of time $\tau_e$ after which the charge is emitted. FIG. 6 similarly shows this state is maintained for a period of time $\tau_c$ after which an additional capture event may occur.

Figure 7:
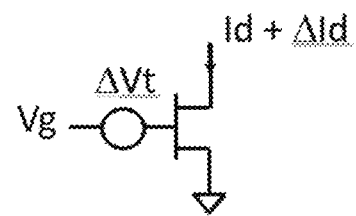
FIG. 7 illustrates one of various examples of a model of RTN.

The phenomena of RTN may be observed as a $\Delta Id$ in the transistor channel and can be modelled as a $\Delta Vt$ that is telegraphic in nature. FIG. 7 shows one of various examples of a model of RTN. The magnitude of $\Delta Vt$ is proportional to $\sim 1/sqrt(Area)$. The impact of RTN is highest in weak inversion where the $\Delta Id/Id$ increases due to a larger ratio of gm/Id, where gm represents the mutual conductance of the transistor in operation. The statistical distribution of $\Delta Vt$ is modelled by an exponential distribution which suffers from a thick tail. RTN can end up being the dominant noise source in ultra-low power MOS circuit designs.

Bluetooth Low Energy, as specified by Bluetooth SIG, Inc., or Bluetooth LE, has two significant states of operation: the advertising state and the connection state. Implementations of a device meeting the Bluetooth LE specification may use a low power resistor-capacitor (RC) oscillator to act as a clock source with a timer to schedule advertising events and connection events. At the end of an advertising event or a connection event the timer can be set for a wake-up time and the device placed into a low power state (deep sleep). Once the timer wakes up the device from deep sleep, the device can advertise or connect and return back to deep sleep to preserve energy before the next wake-up time. RTN will impact the frequency accuracy of the oscillator and therefore the accuracy of when the wake-up timer wakes up the device from deep sleep.

A challenge for the circuit designer is to design an RC oscillator that uses a low power for a given voltage, e.g. a battery source, while meeting the required frequency accuracy.

Figure 4:
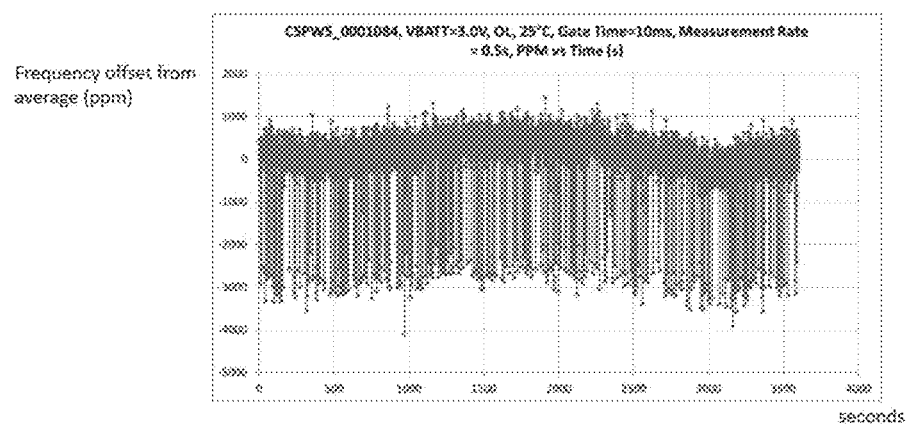
FIG. 4 illustrates one example of RTN in MOSFET devices causing frequency deviations in an RC oscillator.

The telegraphic nature of RTN in transistors, which may provide sudden steps of current in the MOSFET transistors, can significantly impact the frequency accuracy of low power RC oscillators. FIG. 4 shows one example of RTN noise affecting the output frequency of a low power RC oscillator. Large frequency excursions of −4000 ppm are observed on some of the devices. The average frequency accuracy across different devices, with respective RC oscillators, is 900 ppm. Reducing RTN can be accomplished by increasing transistor operating area (to a point) or to operate the oscillator at higher power. However, higher power is a problem for ultra-low power designs for Bluetooth LE based radios, such as medical implants.

In one example, three discrete RC oscillators or one RC oscillator with three bias settings may be used in a radio, such as a Bluetooth LE based radio, to mitigate the impact of RTN for a peripheral device in an advertising state, a peripheral device in a connection state, and a central device in a connection state. In one example, a peripheral device may be a medical device implanted in a body and a central device may be a smart phone. In another example, a peripheral device may be a first hearing aid and the central device may be a second hearing aid paired with the first hearing aid, and at given times, the first and second hearing aids may switch roles so that the second hearing aid acts as the peripheral device and the first hearing aid acts as the central device. In still another example, a hearing aid may be a peripheral device and a smart phone may be a central device.

The advertising state may be an asynchronous mode of operation that does not require a high accuracy clock source, for example, an asynchronous communication mode. It is often desirable to utilize a very low power deep sleep power consumption for the advertising state. For example, a medical implant in the advertising state, which advertises at five seconds (5 s) intervals may have an average power consumption design constraint of ~1.2 µW when a 1.2V voltage source is considered. An RC oscillator, which consumes 120 nW in the deep sleep state, would take up 10% of the average power consumption design constraint.

The connection state may be a synchronous mode of operation where a peripheral device receive (RX) event is synchronized to coincide with a central transmit (TX) event, for example, a synchronous communication mode. The timing accuracy of the central device is required to be within +/−500 ppm but the timing accuracy of the peripheral device may be more relaxed providing that sufficient RX window widening is used. Unfortunately, extra RX window widening leads to extra power consumption. It is therefore important to trade-off the power required to reduce RTN in an RC oscillator to set a certain frequency accuracy with the power consumption in the radio to support a certain RX window widening. Another consideration for the peripheral device in a connection state is that it often consumes more power than the peripheral device in an advertising state due to the higher rate of operation. For example, a hearing aid keep-a-live connection may have an average power consumption for connections events of ~12 µW and ~60 µW for 1 second & 100 ms connection events, respectively, for a peripheral device using a 1.2V voltage source.

A first RC oscillator of the three discrete RC oscillators, or the single RC oscillator in a first of the three bias settings has the respective transistors biased into weak inversion in order to increase the transistor gain and reduce the power consumption. Because advertising events are asynchronous in nature according to an asynchronous communication mode, the time between advertising events does not have to be accurately set, and therefore a peripheral device in the advertising state may utilize the first RC oscillator or the single RC oscillator in the first bias setting. Elevated levels of RTN may cause elevated levels of frequency inaccuracy which may be tolerated without causing problems in meeting the relaxed timing constraints. An example of this is a medical implant that can be in deep sleep for 20 seconds or more between advertising events. Because the advertising events are infrequent the RC oscillator power can have a considerable impact on battery life and may contribute to more than 50% of the radio device power consumption while in the advertising state. Reducing the power consumption in the RC oscillator may extend the life of the product.

The second RC oscillator of the three discrete RC oscillators or the RC oscillator in a second of the three bias settings has the transistors biased in the weak to moderate inversion region, i.e. biased with an increased power consumption as compared to the first RC oscillator or the single RC oscillator in the first bias setting, in order to reduce the impact of RTN on the oscillator period, i.e. on the frequency accuracy. A peripheral device in the connection state may utilize the second RC oscillator of the single RC oscillator in the second bias setting. An example of this is a hearing aid device operating as a peripheral device that maintains a 'keep alive' radio connection with a connection interval of ~125 ms. Because the time interval between connection events is typically shorter than for advertising events, the RC oscillator may consume a higher power and still be significantly less than the overall radio power consumption of the peripheral device. The frequency accuracy of the RC oscillator for the peripheral device can be designed such that the power consumption of the RC oscillator plus radio with RX window widening is reduced, and in some cases minimized.

The third RC oscillator of the three discrete RC oscillators or the RC oscillator in a third of the three bias settings has the transistors biased towards strong inversion, i.e. biased with an increased power consumption as compared to the second RC oscillator or the single RC oscillator in the second bias setting, to reduce the RTN to a level where the oscillator can be used in a central device to provide the specified frequency accuracy, e.g., within +/−500 ppm.

Figure 1A:
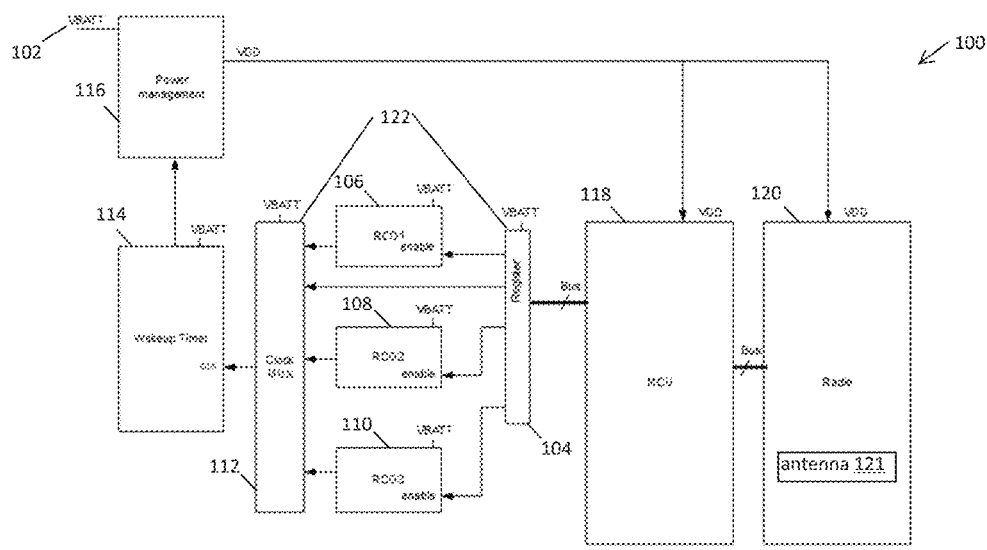
FIG. 1A illustrates a diagram of a reduced power RC oscillator circuit for a low power radio application containing three RC oscillators biased at one of three different levels.

FIG. 1A shows the circuit 100 in various examples. A battery (VBATT) 102 provides power to a register circuit 104, a plurality of RC oscillators, labelled respectively (RCO1) 106, (RCO2) 108, and (RCO3) 110, a clock multiplexer 112, a wakeup timer or wake circuit 114, and a power management circuit 116. In this example, the register 104 and the clock multiplexer 112 combine to form a control circuit 122. The power management circuit 116 provides a VDD supply voltage to a microcontroller unit (MCU) 118, and a radio circuit 120. The radio circuit 120 may comprise an antenna 121 for transmitting a signal. The circuit 100 shown in FIG. 1A may be implemented in either a peripheral device or a central device. The circuit 100, or portions thereof, may be implemented by instructions in storage medium for execution by a processor, a function, library call, subroutine, shared library, software as a service, analog circuitry, digital circuitry, control logic, digital logic circuits programmed through hardware description language, application-specific integrated circuit (ASIC), field-programmable gate array (FPGA), programmable logic device (PLD), or any suitable combination thereof, or any other suitable mechanism, whether in a unitary device or spread over several devices.

Figure 2:
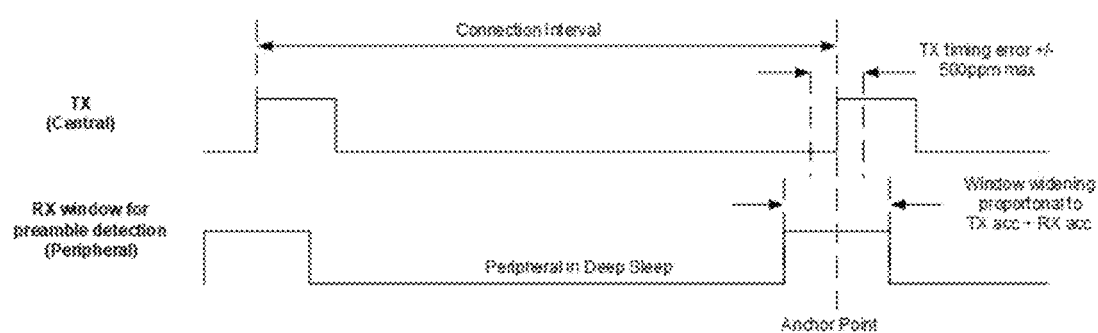
FIG. 2 illustrates timing diagrams for a central device transmission of a connection interval and a peripheral device reception window and deep sleep condition.

In operation, RC oscillator RCO1 106 may be enabled when the circuit is used in a peripheral device in the advertising state, with a typical power consumption of greater than 60 nW and less than 480 nW using a 1.2V voltage source, however this is not meant to be limiting. RC oscillator RCO2 108 may be enabled when the circuit is used in a peripheral device in the connection state, with a power consumption greater than the power consumption of RC oscillator RCO1 106, with a typical power consumption of greater than 0.48 µW and less than 1.2 µW using a 1.2V voltage source. RC oscillator RCO3 110 may be enabled when the circuit is used in a central device in the connection state, with a power consumption greater than the power consumption of RC oscillator RCO2 108, with a typical power consumption of greater than 1.2 µW and less than 3 µW using a 1.2V voltage source. The clock multiplexer 112 may select the enabled one of RC oscillators RCO1 106, RCO2 108 or RCO3 110 for output to the wakeup timer or wake circuit 114. The wakeup timer or wake circuit 114 provides a signal to activate the power management circuit 116. The power management circuit 116 may provide the supply voltage VDD to the MCU 118 and radio circuit 120, at least partially in response to the provided signal to activate the power management circuit 116. Firmware in the MCU 118 may know if the system is a central or peripheral device and whether the device is in an advertising or connection state and enable the appropriate RC oscillator by loading the register circuit 104 with the appropriate value. The register circuit 104, at least partially responsive to the loaded value, may enable one of RC oscillators RCO1 106, RCO2 108, and RCO3 110 via the respective enable inputs. The register circuit 104, at least partially responsive to the loaded value, may send a signal to the clock multiplexer 112 to pass the enabled one of RC oscillators RCO1 106, RCO2 108, and RCO3 110 to the wake-up timer or wake circuit 114. In operation, when RC oscillator RCO1 106 is enabled and passed by the clock multiplexer 112, the radio 120 provides signals in according with timing as a peripheral in the advertising state. The timing of wake-up events may not require a predetermined frequency accuracy. When RC oscillator RCO2 108 is enabled and passed, the radio 120 provides signals in accordance with timing as a peripheral device operating in the connection state. Timing of wake-up events may be synchronized to occur during the connection interval, as shown in FIG. 2. When RC oscillator RCO3 110 is enabled and passed, the radio 120 provides signals in accordance with timing as a central device operating in the connection state. RC oscillator RCO3 110 may provide the frequency accuracy required by the respective specification. In one of various examples, a timing accuracy tolerance of +/−500 ppm may be the required frequency accuracy for the central device operating in the connection state when operating in a Bluetooth Low Energy (BLE) system.

Figure 1B:
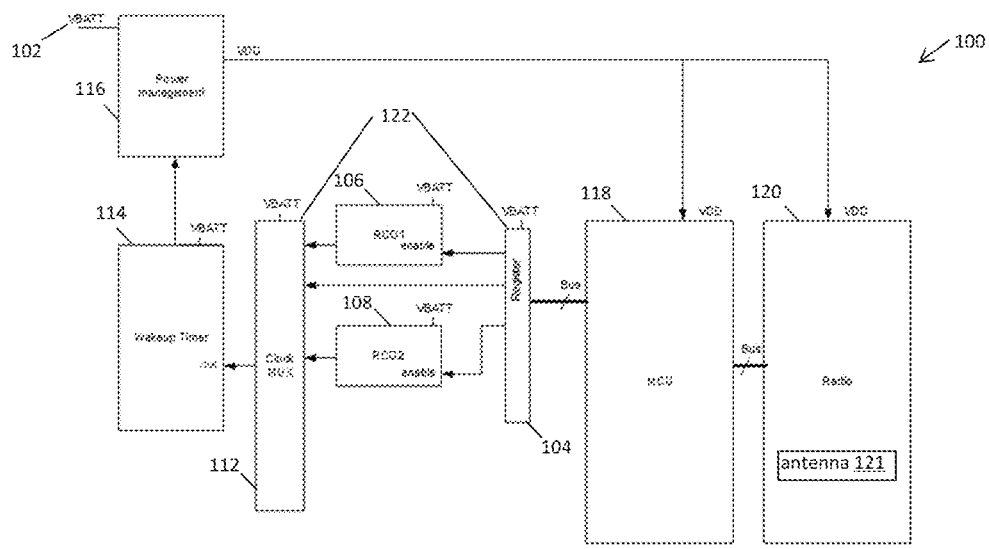
FIG. 1B illustrates a diagram of a reduced power RC oscillator circuit for a low power radio application containing two RC oscillators biased at one of two different levels.

FIG. 1B shows the circuit 100 having two RC oscillators RCO1 and RCO2. In operation, RC oscillator RCO1 106 may be enabled when the circuit is used in a peripheral device in the advertising state, with a typical power consumption of greater than 60 nW and less than 480 nW using a 1.2V voltage source, however this is not meant to be limiting. RC oscillator RCO2 108 may be enabled when the circuit is used in a peripheral or central device in the connection state, with a power consumption greater than the power consumption of RC oscillator RCO1 106, with a typical power consumption of greater than 1.2 µW and less than 3 µW using a 1.2V voltage source.

Figure 1C:
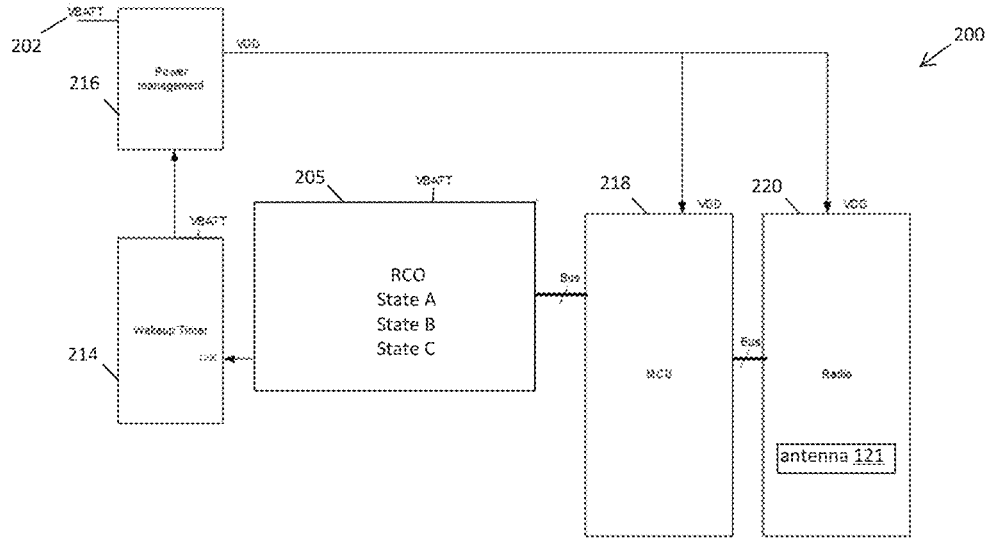
FIG. 1C illustrates a diagram of a reduced power RC oscillator circuit for a low power radio application containing one RC oscillator that can be biased into three different states.

FIG. 1C shows the circuit 200 in another example. A battery (VBATT) 202 provides power to a programmable RC oscillator 205, labelled RCO, a wakeup timer 214, and a power management circuit 216. The power management circuit 216 provides a VDD supply voltage to a microcontroller unit (MCU) 218, and a radio circuit 220, at least partially responsive to a signal from wakeup timer 214. The circuit 200 shown in FIG. 1C may be implemented in either a peripheral device or a central device. The circuit 200 may be implemented at least partially by instructions in storage medium for execution by a processor, a function, library call, subroutine, shared library, software as a service, analog circuitry, digital circuitry, control logic, digital logic circuits programmed through hardware description language, application-specific integrated circuit (ASIC), field-programmable gate array (FPGA), programmable logic device (PLD), or any suitable combination thereof, or any other suitable mechanism, whether in a unitary device or spread over several devices. The programmable RC oscillator RCO 205 may operate in a peripheral advertising state (State A), a peripheral connection state (State B), or a central connection state (State C). A signal from the MCU 218 may select either the peripheral advertising state (State A), the peripheral connection state (State B) or the central connection state (State C). Circuitry of programmable RC oscillator RCO 205 may select a different bias condition based on the MCU signal to keep the RC oscillator RCO frequency accuracy appropriate for the correct state A, B or C.

Figure 1D:
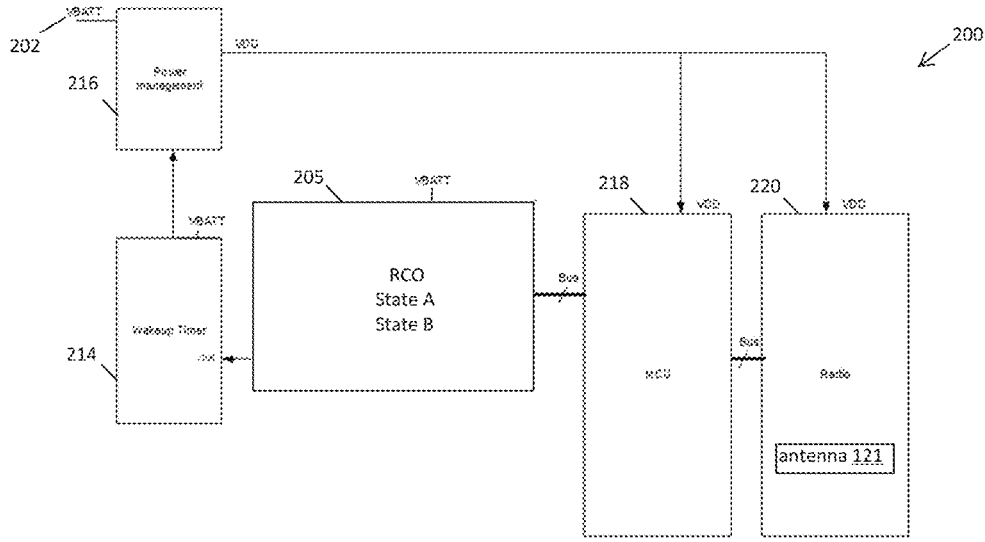
FIG. 1D illustrates a diagram of a reduced power RC oscillator circuit for a low power radio application containing one RC oscillator that can be biased into two different states.

FIG. 1D shows the circuit 200 in another example, which may be implemented in a peripheral device. The programmable RC oscillator RCO 205 may operate in a peripheral advertising state (State A) or a peripheral or central connection state (State B). A signal from the MCU 218 may select either the peripheral advertising state (State A) or the peripheral or central connection state (State B). Circuitry of programmable RC oscillator RCO 205 may select a different bias condition based on the MCU signal to keep the RC oscillator RCO frequency accuracy appropriate for the correct state A or B.

FIG. 2 shows a timing diagram of a connection interval for a central device in the connection state that transmits a signal at a predefined Anchor Point time and a window for preamble detection by a peripheral device in the connection state. In a Bluetooth application, the central device may meet a timing accuracy of +/−500 ppm per connection. The peripheral may enter a deep sleep mode between connection events. The peripheral may provide window widening proportional to the TX timing accuracy (TX acc)+RX timing accuracy (RX acc). The peripheral radio power consumption will be higher as the timing accuracy TX acc+RX acc increases.

FIG. 3A shows three types of RC oscillators. RC oscillator RCO1 may be used by a peripheral device operating in an advertising state. RC oscillator RCO1 may be used for example in a medical implant use case where low power is an important design criteria. A power consumption may be greater than 60 nW and less than 480 nW using a 1.2V voltage source for RC oscillator RCO1. Alternatively, a power consumption may be ~120 nW using a 1.2V voltage source for the RC oscillator RCO1 with a frequency accuracy less accurate than +/−500 ppm such as +/−4000 ppm.

The transistors in RC oscillator RCO1 may be biased in weak inversion to improve the transistor gain and to reduce power consumption. Advertising may be by nature an asynchronous event and therefore does not require an accurate time base, i.e. does not require frequency accuracy.

RC Oscillator RCO2 may be used in a peripheral device operating in a connection state. RC oscillator RCO2 may be used for example in a hearing aid for keep alive connection with reduced power consumption. A power consumption could be greater than 480 nW and less than 1.2 µW using a 1.2V voltage source for RC oscillator RCO2. Alternatively, a power consumption could be ~600 nW using a 1.2V voltage source for RC oscillator RCO2. The transistors in RC oscillator RCO2 may be biased in the weak to moderate inversion region to reduce the impact of RTN and keep power consumption low. The peripheral device may have a clock frequency accuracy less accurate than +/−500 ppm, such as +/−600 ppm. Alternatively, the clock frequency of the peripheral device may be more accurate, such as +/−400 ppm. The average connection power consumption can be established based on two variables—RC oscillator power consumption to support a predetermined frequency accuracy and RX power consumption impacted by extra window widening to compensate for the difference between the required frequency accuracy and the provided frequency accuracy.

RC Oscillator RCO3 may be used in a central device operating in the connection state. RC Oscillator RCO3 may be used for example in a hearing aid acting as the central device for keep alive connection. A power consumption may be greater than 1.2 µW and less than 3 µW using a 1.2V voltage source for RC Oscillator RCO3. Alternatively, a power consumption may be ~2.4 µW using a 1.2V voltage source for the RC Oscillator RCO3. The transistors in RCO3 may be biased in the moderate to strong inversion region reduce the impact of RTN. In a Bluetooth application, the RC oscillator RCO3 may meet the +/−500 ppm frequency accuracy tolerance.

FIG. 3B shows two types of RC oscillators. RC oscillator RCO1 may be used by a peripheral device operating in an advertising state. A power consumption may be greater than 60 nW and less than 480 nW using a 1.2V voltage source for RC oscillator RCO1. Alternatively, a power consumption may be ~120 nW using a 1.2V voltage source for the RC oscillator RCO1 with a frequency accuracy less accurate than +/−500 ppm such as +/−4000 ppm. The transistors in RC oscillator RCO1 may be biased in weak inversion to improve the transistor gain and to reduce power consumption. RC Oscillator RCO2 may be used in the peripheral or central device operating in a connection state. A power consumption could be greater than 1.2 µW and less than 3 µW using a 1.2V voltage source for RC oscillator RCO2. Alternatively, a power consumption could be ~2.4 µW using a 1.2V voltage source for RC oscillator RCO2. The peripheral or central device may have a clock frequency accuracy within +/−500 ppm.

FIG. 3C shows a variable RC Oscillator, RC Oscillator RCO4, which may be utilized in a peripheral device operating in the advertising state, the peripheral device operating in the connection state, and in a central device operating in the connection state. Mode_sel signal may select either the peripheral device advertising state (state A), the peripheral device connection state (state B) or the central device connection state (state C). Circuitry of RC Oscillator RCO4 may select a different bias condition based on the setting of mode_sel to keep the RC Oscillator RCO4 frequency accuracy appropriate for the correct state A, B or C. For example, state A may be selected to set a power consumption greater than 60 nW and less than 480 nW using a 1.2V voltage source for RC Oscillator RCO4. Alternatively, state A may set a power consumption ~120 nW using a 1.2V voltage source for the RC Oscillator RCO4. Selection of state B may set power consumption greater than 480 nW and less than 1.2 µW using a 1.2V voltage source for RC Oscillator RCO4. Alternatively, state B may set a power consumption ~600 nW using a 1.2V voltage source for the RC Oscillator RCO4. Selection of state C may set a power consumption greater than 1.2 µW and less than 3 µW using a 1.2V voltage source for RC Oscillator RCO4. Alternatively, state C may set a power consumption ~2.4 µW using a 1.2V voltage source for the RC Oscillator RCO.

FIG. 3D shows a variable RC Oscillator, RC Oscillator RCO4, which may be utilized in a peripheral device operating in the advertising state or connection state. Mode_sel signal may select either the peripheral device advertising state (state A) or the peripheral or central device connection state (state B). Circuitry of RC Oscillator RCO4 may select a different bias condition based on the setting of mode_sel to keep the RC Oscillator RCO4 frequency accuracy appropriate for the correct state A or B. For example, state A may be selected to set power consumption greater than 60 nW and less than 480 nW using a 1.2V voltage source for RC Oscillator RCO4. Alternatively, state A may set power consumption ~120 nW using a 1.2V voltage source for the RC Oscillator RCO4. Selection of state B may set power consumption greater than 1.2 µW and less than 3 µW using a 1.2V voltage source for RC Oscillator RCO4. Alternatively, state B may set power consumption ~2.4 µW using a 1.2V voltage source for the RC Oscillator RCO4.

FIG. 3E shows three types of RC oscillators. RC oscillator RCO1 may be used by a peripheral device operating in an advertising state. Power consumption may be greater than 60 nW and less than 480 nW using a 1.2V voltage source for RC oscillator RCO1. Alternatively, power consumption may be ~120 nW using a 1.2V voltage source for the RC oscillator RCO1 with a frequency accuracy less accurate than +/−500 ppm such as +/−4000 ppm. The transistors in RC oscillator RCO1 may be biased in weak inversion to improve the transistor gain and to reduce power consumption. RC Oscillator RCO2 may be used in the peripheral or central device operating in a connection state. Power consumption could be greater than 1.2 µW and less than 3 µW using a 1.2V voltage source for RC oscillator RCO2. Alternatively, power consumption could be ~2.4 µW using a 1.2V voltage source for RC oscillator RCO2. The peripheral or central device may have a clock frequency accuracy within +/−500 ppm. RC Oscillator RCO3, which may be utilized in a peripheral device operating in the advertising state or connection state. Mode_sel signal may select either the peripheral device advertising state (state A) or the peripheral or central device connection state (state B). Circuitry of RC Oscillator RCO3 may select a different bias condition based on the setting of mode_sel to keep the RC Oscillator RCO3 frequency accuracy appropriate for the correct state A or B. For example, state A may be selected to set power consumption greater than 60 nW and less than 480 nW using a 1.2V voltage source for RC Oscillator RCO3. Alternatively, state A may set power consumption ~120 nW using a 1.2V voltage source for the RC Oscillator RCO3. Selection of state B may set power consumption greater than 1.2 µW and less than 3 µW using a 1.2V voltage source for RC Oscillator RCO3. Alternatively, state B may set power consumption ~2.4 µW using a 1.2V voltage source for the RC Oscillator RCO3.

Figure 8:
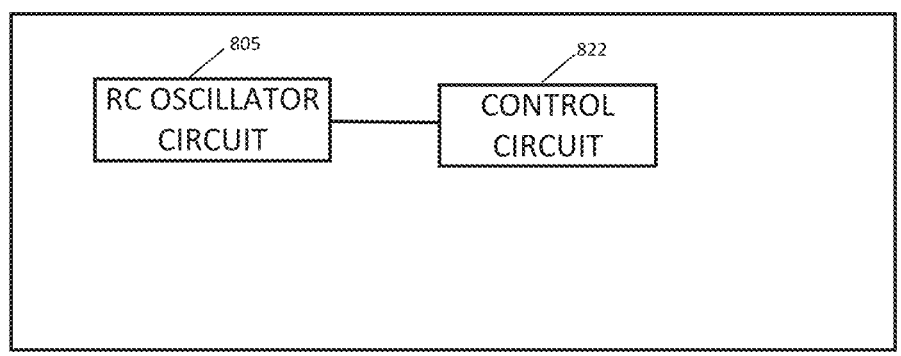
FIG. 8 illustrates a device having an RC oscillator circuit and a control circuit.

FIG. 8 illustrates a device that has a RC oscillator circuit 805 and a control circuit 822.

Figure 9A:
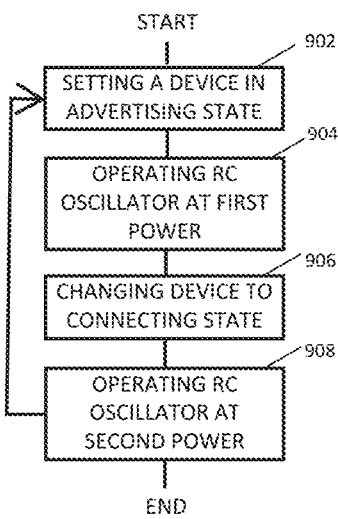
FIG. 9A illustrates a method for mitigating RTN by setting a device in an advertising state, operating an RC oscillator at a first power, changing the device to a connecting state, and operating the RC oscillator at a second power.

FIG. 9A illustrates a method for setting 902 a peripheral device in an advertising state, operating 904 an RC oscillator at a first bias state, changing 906 the device to a peripheral device in a connecting state, and operating 908 the RC oscillator at a second bias state.

Figure 9B:
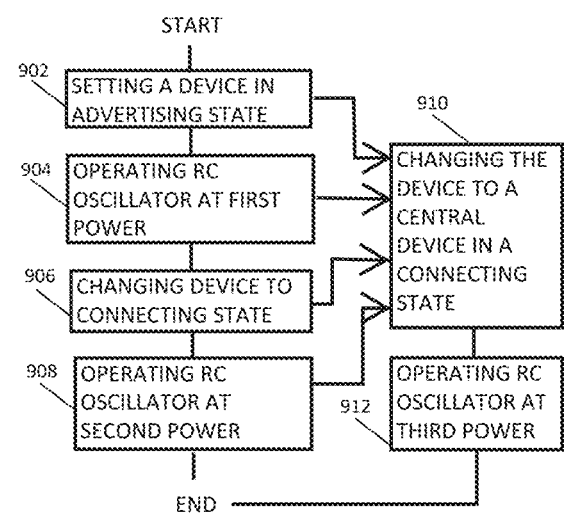
FIG. 9B illustrates a method as in FIG. 9A for changing the device to a central device in a connecting state and operating the RC oscillator at a third power.

FIG. 9B illustrates an alternative method that may include changing 910 the device to a central device in a connecting state, and operating 912 the RC oscillator at a third bias state. For the methods of FIGS. 9A and 9B, there is no requirement that the flow be in any particular order, and thus a peripheral device in the advertising state may change to a central device in the connecting state, i.e. to operating the RC oscillator at the third bias state without exceeding the scope. Similarly, the methods may include changing the device from the second bias state to the first bias state, or changing the device from the third bias state to the first bias state.

In one example, the device may be selected from a low power peripheral radio device and a low power central radio device, and an operating state may be selected from a radio advertising state, a peripheral radio connection state, and a central radio connection state, with respective power consumption and frequency accuracy.

Figure 10:
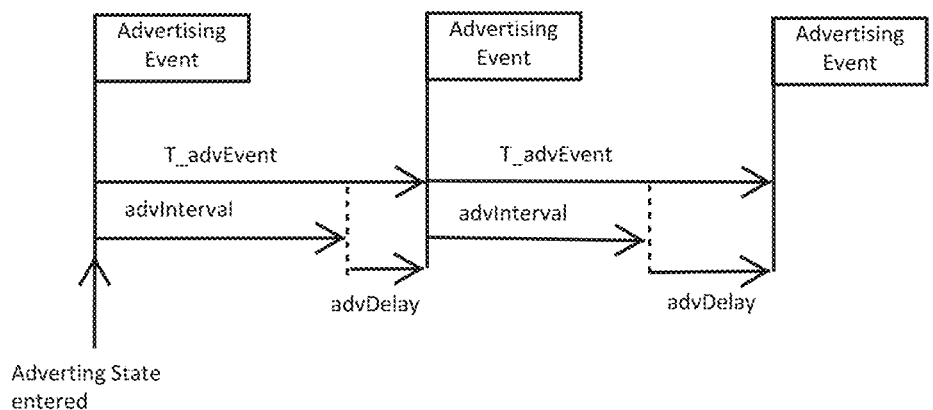
FIG. 10 illustrates a timing chart for advertising events based on an adverting interval and a randomly generated advertising delay.

FIG. 10 illustrates a timing chart for advertising events. An advertising state may be initiated by a peripheral device. It may send data on predetermined channels, e.g., channels 37/38/39, to whatever other devices may be listening. The data may be an advertising message, the transmission of the advertising message may be an advertising event. An advertising event may be an asynchronous event, such that there may be an advertising period (T_advEvent) between subsequent advertising events, with a random time component (advDelay) according to an asynchronous communication mode as shown. In this context, asynchronous means that the peripheral can initiate an advertising message at any time and the advertising period is thus, from a receiver's (i.e. central device's) standpoint, random. A central device may be listening to the predetermined channels, so that the advertising event may occur at any particular point in absolute time. The peripheral device may have no a priori knowledge of when the central device is listening. The advertising period may determine the time between subsequent transmission of an advertising message. Thus, the accuracy of the advertising period is not critical. Once a connection is established, the timing between the central device and the peripheral device may be synchronized. A relaxed clock accuracy may be used to conserve power in the deep sleep interval in the peripheral device when in the advertising state.

Figure 11:
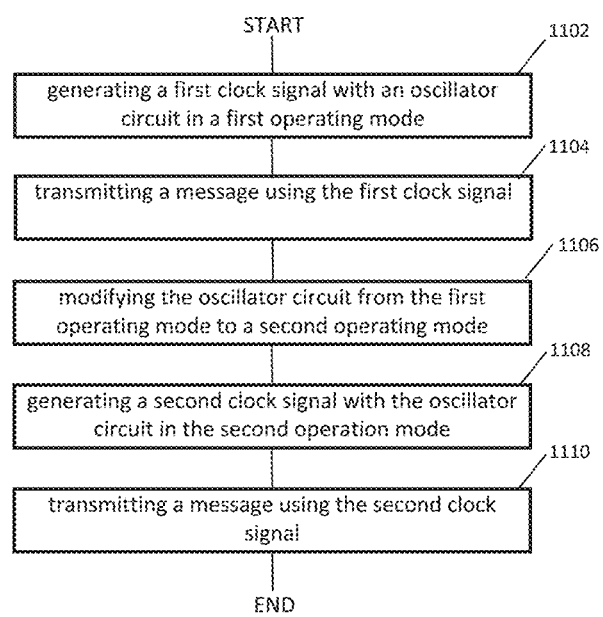
FIG. 11 illustrates a method for mitigating RTN by generating a first clock signal, transmitting a message using the first clock signal, modifying the oscillator circuit, generating a second clock signal, and transmitting a message using the second clock signal.

FIG. 11 illustrates a method for generating 1102 a first clock signal with an oscillator circuit in a first operating mode, transmitting 1104 a message using the first clock signal, modifying 1106 the oscillator circuit from the first operating mode to a second operating mode, generating 1108 a second clock signal with the oscillator circuit in the second operating mode, and transmitting 1110 a message using the second clock signal.

Although examples have been described above, other variations and examples may be made from this disclosure without departing from the spirit and scope of these disclosed examples.

Figure 12A:
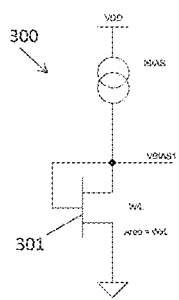
FIG. 12A illustrates a bias voltage generator circuit having a transistor with a fixed transistor area of W×L that consumes a bias current of IBIAS, wherein the operating region of the transistor is in weak inversion.

FIG. 12A shows a bias voltage generator circuit 300 having a transistor 301 with a fixed transistor area of W×L that consumes a bias current of IBIAS. The operating region of the transistor is in weak inversion.

Figure 12B:
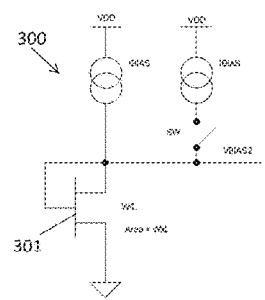
FIG. 12B illustrates a bias voltage generator circuit having a transistor with fixed area W×L and a switched bias current IBIAS or 2×IBIAS via a switch SW, wherein the circuit may be controllable to modify a transistor operating region of the transistor in the oscillator circuit.

FIG. 12B shows a bias voltage generator circuit 300 having a transistor 301 with fixed area W×L and a switched bias current IBIAS or 2×IBIAS via a switch SW. The operating region of the transistor depends on the bias current and is in weak inversion with a bias current of IBIAS or moderate inversion with a bias current of 2×IBIAS. The magnitude of RTN may be reduced when the operating region changes from weak inversion to moderate inversion. This bias voltage generator circuit 300 may be controllable to modify a transistor operating region of transistor 301 in the oscillator circuit.

Figure 12C:
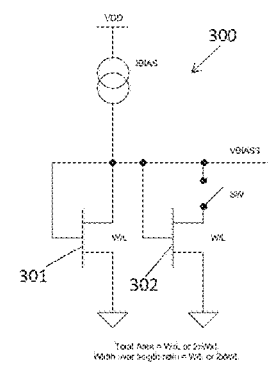
FIG. 12C illustrates a bias voltage generator circuit having two transistors with a fixed bias current IBIAS and a switched area of W×L or 2×W×L via a switch SW, wherein the circuit may be controllable to modify a transistor operating area of the transistors in the oscillator circuit.

FIG. 12C shows a bias voltage generator circuit 300 having two transistors 301 and 302 with a fixed bias current IBIAS and a switched area of W×L or 2×W×L via a switch SW, which when closed places transistors 301 and 302 in parallel. The operating region of the transistor depends on the width over length ratio and will be in weak inversion for a ratio of W/L and will be in deeper weak inversion for a ratio of 2×W/L. The magnitude of RTN may be reduced due to the increase in area but may also be increased due to the operating region changing from weak inversion to deeper weak inversion. This circuit may not be a solution for reducing RTN when transistor area is increased. This bias voltage generator circuit 300 may be controllable to modify a transistor operating area of transistors 301 and 302 in the oscillator circuit.

Figure 12D:
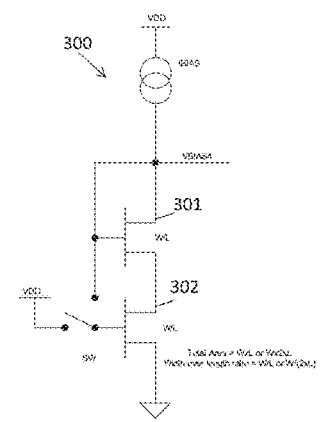
FIG. 12D illustrates a bias voltage generator circuit having two transistors with a fixed bias current IBIAS and a switched area of W×L or W×2×L via a switch SW, wherein the circuit may be controllable to modify a transistor operating area of transistors in the oscillator circuit.

FIG. 12D shows a bias voltage generator circuit 300 having two transistors 301 and 302 with a fixed bias current IBIAS and a switched area of W×L or W×2×L via a switch SW which when closed places transistors 301 and 302 in series, with a common gate. The operating region of the transistor may depend on the width over length ratio and may be in weak inversion for a ratio of W/L and may be in moderate inversion for a ratio of W/(2×L). The magnitude of RTN may be reduced due to the increase in area and may also be reduced due to the operating region changing from weak inversion to moderate inversion. This circuit may be a solution for reducing RTN when transistor area is increased. This bias voltage generator circuit 300 may be controllable to modify a transistor operating area of transistors 301 and 302 in the oscillator circuit.

The invention claimed is:

1. A device comprising:
an oscillator circuit modifiable between a first operating mode and a second operating mode,
wherein the first operating mode has a first frequency accuracy and a first current consumption,
wherein the second operating mode has a second frequency accuracy and a second current consumption,
wherein the second frequency accuracy is more accurate than the first frequency accuracy and the second current consumption is higher than the first current consumption, wherein the first operating mode comprises a respective transistor biased into weak inversion and the second operating mode comprises a respective transistor biased into moderate inversion, wherein the second operating mode generates less random telegraph noise than the first operating mode; and
a control circuit in communication with the oscillator circuit to modify the operating mode of the oscillator circuit.

2. The device as claimed in claim 1, wherein the oscillator circuit comprises two discrete resistor-capacitor oscillators and the control circuit modifies the operating mode by selecting between the two oscillators.

3. The device as claimed in claim 1, wherein the oscillator circuit comprises a resistor-capacitor oscillator that has two bias current settings and the control circuit modifies the operating mode by selecting between the two bias current settings.

4. The device as claimed in claim 1, wherein the oscillator circuit comprises a third operating mode, wherein the third operating mode has a third frequency accuracy and a third current consumption, wherein the third frequency accuracy is more accurate than the second frequency accuracy and the third current consumption is higher than the second current consumption.

5. The device as claimed in claim 4, wherein the third operating mode comprises a strong inversion mode.

6. The device as claimed in claim 4, wherein the first current consumption is between 50 nA and 200 nA, wherein the second current consumption is between 400 nA and 1.00 µA, and wherein the third current consumption is between 1.5 µA and 2.5 µA.

7. The device as claimed in claim 4 wherein the first current consumption is between 50 nA and 300 nA, wherein the second current consumption is between 300 nA and 1.25 µA, and wherein the third current consumption is between 1.25 µA and 2.5 µA.

8. The device as claimed in claim 4, wherein the device is selected from a low power peripheral radio device and a low power central radio device, and wherein the first operating mode is a radio advertising state, the second operating mode is a radio connection state, and the third operating mode is a radio connection state.

9. The device as claimed in claim 4, wherein the third frequency accuracy tolerance is +/−500 ppm.

10. The device as claimed in claim 1, wherein the device is a low power peripheral radio device, and wherein the first operating mode is a radio advertising state and the second operating mode is a radio connection state.

11. A method comprising:
generating a first clock signal with an oscillator circuit in a first operating mod; wherein the oscillator circuit is modifiable between a first operating mode and a second operating mode, wherein the first operating mode has a first frequency accuracy and a first current consumption, wherein the second operating mode has a second frequency accuracy and a second current consumption;
transmitting a message using the first clock signal;
modifying the oscillator circuit from the first operating mode to a second operating mode, wherein the second frequency accuracy is more accurate than the first frequency accuracy and the second current consumption is hither than the first current consumption, wherein the first operating mode is biased into weak inversion and the second operating mode is biased into moderate inversion, wherein the second operating mode generates less random telegraph noise than the first operating mode;
generating a second clock signal with the oscillator circuit in the second operating mode; and
transmitting a message using the second clock signal.

12. The method as claimed in claim 11, wherein the first operating mode comprises an asynchronous communication mode.

13. The method as claimed in claim 12, wherein modifying the oscillator circuit comprises setting the oscillator circuit to consume current greater than 50 nA and less than 200 nA.

14. The method as claimed in claim 11, wherein the second operating mode comprises a synchronous communication mode in a peripheral device.

15. The method as claimed in claim 14, wherein modifying the oscillator circuit comprises setting an oscillator circuit to consume current greater than 400 nA and less than 1000 nA.

16. The method as claimed in claim 11, comprising:
modifying the oscillator circuit from the second operating mode to a third operating mode;
generating a third clock signal with the oscillator circuit in the third operating mode; and
transmitting a message using the third clock signal.

17. The method as claimed in claim 16, wherein the third operating mode comprises a synchronous connection mode in a central device.

18. The method as claimed in claim 16, wherein modifying the oscillator circuit comprises setting the oscillator circuit to consume current greater than 1.5 uA and less than 2.5 uA.

19. A system comprising:
a power management circuit;
a radio circuit electrically connected to the power management circuit, wherein the radio circuit outputs signals to an antenna;
an oscillator circuit electrically connected to the power management circuit, wherein the oscillator circuit is modifiable between first and second operating modes, wherein the first operating mode has a first frequency accuracy and a first current consumption, wherein the second operating mode has second frequency accuracy and a second current consumption, wherein the second frequency accuracy is more accurate than the first frequency accuracy and the second current consumption is higher than the first current consumption, wherein the first operating mode comprises a respective transistor biased into weak inversion and the second operating mode comprises a respective transistor biased into moderate inversion, wherein the second operating mode generates less random telegraph noise than the first operating mode;
a control circuit electrically connected to the radio circuit, the power management circuit and the oscillator circuit, wherein the control circuit modifies the operating mode of the oscillator circuit; and
a wake circuit electrically connected to the oscillator circuit and the power management circuit, wherein the wake circuit produces a signal to the power management circuit based on the operating mode of the oscillator circuit.

20. The system as claimed in claim 19, wherein the oscillator circuit comprises two discrete resistor-capacitor oscillators and the control circuit modifies the operating mode by selecting between the two oscillators.

21. The system as claimed in claim 19, wherein the oscillator circuit comprises a resistor-capacitor oscillator that has two bias current settings and the control circuit modifies the operating mode by selecting between the two bias current settings.

* * * * *

UNITED STATES PATENT AND TRADEMARK OFFICE
CERTIFICATE OF CORRECTION

PATENT NO. : 11,949,377 B2
APPLICATION NO. : 17/987153
DATED : April 2, 2024
INVENTOR(S) : Andrew Bottomley et al.

It is certified that error appears in the above-identified patent and that said Letters Patent is hereby corrected as shown below:

In the Claims

Column 13, Line 37:
"a first operating mod; wherein the oscillator circuit is"
Change to: --a first operating mode; wherein the oscillator circuit is--

Column 13, Line 48:
"tion is hither than the first current consumption,"
Change to: --tion is higher than the first current consumption,--

Signed and Sealed this
Fourteenth Day of May, 2024

Katherine Kelly Vidal
*Director of the United States Patent and Trademark Office*